US008723229B2

(12) United States Patent
Hikita et al.

(10) Patent No.: US 8,723,229 B2
(45) Date of Patent: May 13, 2014

(54) SEMICONDUCTOR DEVICE AND METHOD OF MANUFACTURING THE DEVICE

(75) Inventors: Masahiro Hikita, Toyama (JP);
Kenichiro Tanaka, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 32 days.

(21) Appl. No.: 13/182,122

(22) Filed: Jul. 13, 2011

(65) Prior Publication Data

US 2011/0266554 A1 Nov. 3, 2011

Related U.S. Application Data

(63) Continuation of application No. PCT/JP2009/006873, filed on Dec. 15, 2009.

(30) Foreign Application Priority Data

Mar. 23, 2009 (JP) .................................. 2009-070186

(51) Int. Cl.
*H01L 21/02* (2006.01)
*H01L 29/66* (2006.01)
*H01L 29/15* (2006.01)

(52) U.S. Cl.
USPC ............. 257/200; 257/76; 257/192; 257/194; 257/473

(58) Field of Classification Search
USPC ...................... 257/76, 192, E21.09, E29.091, 257/E29.242, 200, 201; 438/478
See application file for complete search history.

(56) References Cited

U.S. PATENT DOCUMENTS

| 6,919,590 | B2 * | 7/2005 | Hill et al. ........................ 257/192 |
| 7,460,576 | B2 * | 12/2008 | Hashimoto ................ 372/50.22 |
| 2005/0189559 | A1 | 9/2005 | Saito et al. |
| 2006/0180831 | A1 | 8/2006 | Nakazawa et al. |
| 2007/0045670 | A1 | 3/2007 | Kuraguchi |
| 2008/0087915 | A1 * | 4/2008 | Uemoto et al. ................ 257/192 |
| 2008/0308843 | A1 | 12/2008 | Twynam |
| 2010/0155699 | A1 * | 6/2010 | Sakong et al. .................. 257/14 |

FOREIGN PATENT DOCUMENTS

| JP | 2005-244072 | 9/2005 |
| JP | 2006-261642 | 9/2006 |
| JP | 2007-035905 | 2/2007 |
| JP | 2007-067240 | 3/2007 |
| JP | 2007-158143 | 6/2007 |

(Continued)

OTHER PUBLICATIONS

T. Kawasaki et al., "Normally-off AlGaN/GaN HEMT with Recessed Gate for High Power Applications," Extended Abstracts of the 2005 International Conference on Solid State Devices and Materials, Kobe, 2005, pp. 206-207.

(Continued)

*Primary Examiner* — George Fourson, III
*Assistant Examiner* — Wilner Jean Baptiste
(74) *Attorney, Agent, or Firm* — McDermott Will & Emery LLP

(57) ABSTRACT

In a manufacturing method of a semiconductor device, first, a first semiconductor layer, a second semiconductor layer, and a p-type third semiconductor layer are sequentially epitaxially grown on a substrate. After that, the third semiconductor layer is selectively removed. Then, a fourth semiconductor layer is epitaxially grown on the second semiconductor layer. Then, a gate electrode is formed on the third semiconductor layer.

10 Claims, 5 Drawing Sheets

(56) References Cited

FOREIGN PATENT DOCUMENTS

| JP | 2008-010526 | 1/2008 |
|---|---|---|
| JP | 2008-078526 | 4/2008 |
| JP | 2008-098434 | 4/2008 |
| JP | 2008-124373 | 5/2008 |

OTHER PUBLICATIONS

M. Kuroda et al., "Normally-off Operation of Non-polar AlGaN/GaN Heterojunction FETs Grown on R-plane Sapphire," Extended Abstracts of the 2005 International Conference on Solid State Devices and Materials, Kobe, 2005, pp. 470-471.

* cited by examiner (a)

(b)

(c)

(a)

(b)

(a)

(b)

SEMICONDUCTOR DEVICE AND METHOD OF MANUFACTURING THE DEVICE

CROSS-REFERENCE TO RELATED APPLICATION

This is a continuation of PCT International Application PCT/JP2009/006873 filed on Dec. 15, 2009, which claims priority to Japanese Patent Application No. 2009-070186 filed on Mar. 23, 2009. The disclosures of these applications including the specifications, the drawings, and the claims are hereby incorporated by reference in their entirety.

BACKGROUND

The present disclosure relates to semiconductor devices and methods of manufacturing the devices, and more particularly to power transistors using nitride semiconductor and methods of manufacturing the transistors.

In recent years, field effect transistors (FETs) using gallium nitride (GaN) semiconductor have been actively researched as high-frequency high-power devices. GaN can form various alloys with aluminum nitride (AlN) and indium nitride (InN). Therefore, similar to conventional arsenic semiconductor such as gallium arsenide (GaAs) semiconductor, a heterojunction can be formed.

In particular, a heterojunction of nitride semiconductor has the feature that carriers at high concentration are generated at a junction interface by spontaneous polarization or piezoelectric polarization even without doping. As a result, when made of nitride semiconductor, a FET tends to be of a depression type (a normally-on type) and characteristics of an enhancement type (a normally-off type) are difficult to obtain. However, at present, most devices used in power electronics markets are of a normally-off type, and a normally-off type is strongly demanded in a FET using GaN nitride semiconductor.

A normally-off FET can be formed by shifting a threshold voltage toward a positive direction by, e.g., burying a gate portion. (See, for example, T. Kawasaki et al., Solid State Devices and Materials 2005 tech. digest, 2005, p. 206.) A method of forming a FET on the (10-12) plane of a sapphire substrate not to cause a polarization electric field in a crystal growth direction of nitride semiconductor is known. (See, for example, M. Kuroda et al., Solid State Devices and Materials 2005 tech. digest, p. 470.) Furthermore, a junction field effect transistor (JFET) including a p-type GaN layer formed in a gate portion is also suggested as an expected structure for realizing a normally-off FET. (See, for example, Japanese Patent Publication No. 2005-244072.) In a JFET structure, piezoelectric polarization occurring at a hetero interface between a channel layer made of undoped GaN and a barrier layer made of AlGaN is cancelled by piezoelectric polarization occurring at a hetero interface between the barrier layer made of AlGaN and a p-type GaN layer. This reduces two dimensional electron gas concentration directly under the gate portion in which the p-type GaN layer is formed, thereby providing normally-off characteristics. Moreover, by using for a gate, a pn junction with higher built-in potential than a Schottky junction, a rising voltage of the gate can be increased to reduce a gate leak current even when a positive gate voltage is applied.

SUMMARY

However, a conventional JFET has the problem that on-resistance increases when a threshold voltage is raised in a positive direction. In order to raise a threshold voltage in a positive direction in a conventional JFET, a polarization charge amount needs to be reduced to reduce two dimensional electron gas concentration by reducing an Al composition ratio of a barrier layer of AlGaN or a thickness of the layer. In each case, the threshold voltage rises in the positive direction, channel resistance between the gate and the source and between the gate and drain increases to increase on-resistance.

The present inventors actually formed the above-described JFET, and found that the phenomenon called current collapse occurs. Specifically, when a gate is turned on from an off-state directly after applying a high drain voltage, a drain current decreases and on-resistance increases as compared to the case where no drain voltage is applied. An increase in the on-resistance due to the current collapse is a crucial problem in a power transistor in which a high drain voltage is applied.

It is an objective of the present disclosure to reduce on-resistance in a semiconductor device such as a junction field effect transistor. As necessary, a threshold voltage can be raised and current collapse can be reduced without increasing the on-resistance.

A manufacturing method of a semiconductor device according to the present disclosure includes selectively removing a p-type semiconductor layer grown on a barrier layer, and then regrowing a semiconductor layer on the barrier layer.

An example method of manufacturing a nitride semiconductor device includes the steps of: (a) sequentially epitaxially growing on a substrate, a first semiconductor layer, and a second semiconductor layer having greater bandgap energy than the first semiconductor layer; (b) epitaxially growing a p-type third semiconductor layer on the second semiconductor layer; (c) selectively removing the third semiconductor layer; (d) after the step (c), epitaxially growing a fourth semiconductor layer on the second semiconductor layer; and (e) forming a gate electrode on the third semiconductor layer.

According to the example method of manufacturing the semiconductor device, the multilayer of the second semiconductor layer and the fourth semiconductor layer can be formed on the first semiconductor layer other than a portion under the third semiconductor layer. This increases the thickness of the semiconductor layer formed on the first semiconductor layer other than the portion under the third semiconductor layer. This results in an increase in two dimensional electron concentration between a gate and a source and between the gate and a drain, and reduction in on-resistance without dropping the threshold voltage. Furthermore, since a long distance can be obtained from the surface of the semiconductor layer to the channel between the gate and the source and between the gate and the drain, there is the advantage of reducing current collapse. Furthermore, the semiconductor layer under the gate electrode can be formed by continuous growth so that only epitaxial growth having high control characteristics determines the layer structure. As a result, a semiconductor device with high reproducibility of the threshold voltage can be provided.

In the example method of manufacturing the nitride semiconductor device, in the step (d), the fourth semiconductor layer may be epitaxially grown with a top surface of the third semiconductor layer covered with a mask. Furthermore, in the step (d), the fourth semiconductor layer may be epitaxially grown to cover the third semiconductor layer. In the step (e), an opening may be formed in the fourth semiconductor layer, and then, the gate electrode may be electrically connected to the third semiconductor layer.

An example nitride semiconductor device includes a substrate; a first semiconductor layer formed on the substrate; a second semiconductor layer formed on the first semiconductor layer, and having greater bandgap energy than the first semiconductor layer; a p-type third semiconductor layer selectively formed on the second semiconductor layer; a fourth semiconductor layer formed on the second semiconductor layer; and a gate electrode formed on the third semiconductor layer. The second semiconductor layer and the fourth semiconductor layer are not in-situ formed.

The example nitride semiconductor device includes on the second semiconductor layer, the fourth semiconductor layer formed to expose the top surface of the third semiconductor layer. This increases the thickness of the semiconductor layer formed on the first semiconductor layer between the gate and the source and between the gate and the drain, even when the thickness of the second semiconductor layer is reduced and the threshold voltage is raised. This results in an increase in two dimensional electron concentration between the gate and the source and between the gate and the drain, and reduction in on-resistance. Furthermore, since a long distance can be obtained from the surface of the semiconductor layer to the channel between the gate and the source and between the gate and the drain, there is the advantage of reducing current collapse.

In the example nitride semiconductor device, a composition of the fourth semiconductor layer may change continuously or gradually. At least a part of the fourth semiconductor layer may have greater bandgap energy than the second semiconductor layer. In this case, a part of the fourth semiconductor layer, which is in contact with the second semiconductor layer, is preferably lattice matched with the second semiconductor layer.

In the example nitride semiconductor device, the fourth semiconductor layer may be a multilayer formed by stacking a plurality of layers having different compositions.

In the nitride semiconductor device, the first semiconductor layer may be made of GaN. The second semiconductor layer may be made of $Al_xGa_{1-x}N$, where $0<x\leq1$. The third semiconductor layer may be made of $Al_yGa_{1-y}N$, where $0\leq y\leq1$. The fourth semiconductor layer may be made of $Al_zGa_{1-z}N$, where $0\leq z\leq1$.

The example nitride semiconductor device may be a normally-off transistor.

According to the semiconductor device and the method of manufacturing the device of the present disclosure, on-resistance can be reduced in a semiconductor device such as a junction field effect transistor.

DETAILED DESCRIPTION

Figure 1:
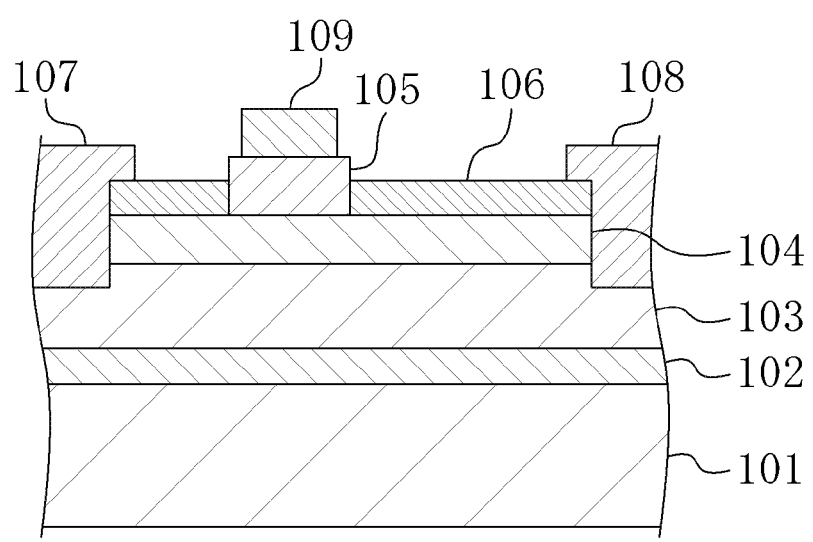
FIG. 1 is a cross-sectional view illustrating a semiconductor device according to an embodiment.

FIG. 1 illustrates a cross-sectional structure of a semiconductor device according to an embodiment. As shown in FIG. 1, in the example semiconductor device, a first semiconductor layer 103 and a second semiconductor layer 104 having greater bandgap energy than the first semiconductor layer 103 are sequentially formed on the (0001) plane of a substrate 101 made of sapphire, with a buffer layer 102 having a thickness of 100 nm and made of AlN interposed therebetween. The first semiconductor layer 103 may have a thickness of 2 μm and may be made of undoped GaN. The second semiconductor layer 104 may have a thickness of 15 nm and may be made of undoped AlGaN with the Al composition ratio of 15%. A third semiconductor layer 105 having a thickness of 100 nm and made of p-type GaN is formed on a gate region of the second semiconductor layer 104. A fourth semiconductor layer 106 having a thickness of 35 nm and made of undoped AlGaN with the Al composition ratio of 15% is formed on the second semiconductor layer 104 other than the gate region. In this embodiment, "undoped" means that impurities are not intentionally introduced.

A gate electrode 109 made of palladium (Pd) is formed on the third semiconductor layer 105. The gate electrode 109 is in an ohmic contact with the third semiconductor layer 105. A source electrode 107 and a drain electrode 108 are formed on both sides of the gate electrode 109. In this embodiment, the source electrode 107 and the drain electrode 108 are formed in a recess penetrating the fourth semiconductor layer 106 and the second semiconductor layer 104 and reaching a portion under the interface between the first semiconductor layer 103 and the second semiconductor layer 104. This structure allows the source electrode 107 and the drain electrode 108 to be in a direct contact with a two dimensional electron gas (2DEG) layer occurring near a heterojunction interface between the first semiconductor layer 103 and the second semiconductor layer 104, thereby reducing contact resistance. Each of the source electrode 107 and the drain electrode 108 may be a multilayer of a titanium (Ti) layer and an aluminum (Al) layer. The form is not necessarily a recess, as long as the source electrode 107 and the drain electrode 108 are in an ohmic contact with the 2DEG layer which is a channel.

The third semiconductor layer 105 is doped with p-type impurities such as magnesium (Mg). The doping amount of Mg may be, for example, about $1\times10^{20}$ cm$^{-3}$ in a region directly under the gate electrode with a depth of 10 nm, and about $1\times10^{19}$ cm$^{-3}$ in other regions with carrier concentration of about $1\times10^{18}$ cm$^{-3}$.

In order to obtain a positive great value as the threshold voltage, piezoelectric polarization occurring at the interface between the channel layer and the barrier layer is preferably small. Thus, when the channel layer is a GaN layer and the barrier layer is an AlGaN layer, the Al composition ratio and the thickness of the AlGaN layer are preferably reduced. On the other hand, in order to reduce on-resistance, piezoelectric polarization occurring at the interface between the channel layer and the barrier layer is preferably great. Thus, the Al composition ratio and the thickness of the AlGaN layer are preferably increased. In the semiconductor device of this embodiment, the fourth semiconductor layer 106 does not exist directly under the third semiconductor layer 105, but exists between the gate and the source and between the gate and the drain. Thus, piezoelectric polarization occurring between the gate and the source and between the gate and the drain can be greater than the piezoelectric polarization occurring directly under the gate electrode. This raises the threshold voltage, and reduces channel resistance between the gate and the source and between the gate and the drain. This provides both of normally-off characteristics and low on-resistance.

In the semiconductor device of this embodiment, the Al composition ratios of the second semiconductor layer 104 and the fourth semiconductor layer 106 are both 15%. However, the Al composition ratios of the second semiconductor layer 104 and the fourth semiconductor layer 106 may be different. When the Al composition ratio of the second semiconductor layer 104 is reduced, the threshold voltage can be raised. When the Al composition ratio of the fourth semiconductor layer 106 is increased, on-resistance can be reduced. Since the bandgap of the fourth semiconductor layer 106 is preferably equal to or wider than the bandgap of the second semiconductor layer 104, the Al composition ratio of the fourth semiconductor layer 106 is preferably higher than the Al composition ratio of the second semiconductor layer 104. The ratios are not limited thereto. For example, when the thickness of the fourth semiconductor layer 106 is larger than the thickness of the second semiconductor layer 104, the Al composition ratio of the fourth semiconductor layer 106 can be lower than the Al composition ratio of the second semiconductor layer 104. Even when the fourth semiconductor layer 106 is made of GaN containing no Al, the advantage of reducing on-resistance can be obtained by using n-GaN doped with n-type impurities. Furthermore, the thickness of the second semiconductor layer 104 is preferably as small as possible, and the thickness of the fourth semiconductor layer 106 is preferably as large as possible. Note that, the thickness of the fourth semiconductor layer 106 is equal to or smaller than a critical thickness in which the layer is formed without causing any crack. While the thickness of the fourth semiconductor layer 106 is preferably larger than the thickness of the second semiconductor layer 104, the thicknesses are not limited thereto. For example, when the Al composition ratio of the fourth semiconductor layer 106 is higher than the Al composition ratio of the second semiconductor layer 104, the thickness of the fourth semiconductor layer 106 can be smaller than the thickness of the second semiconductor layer 104.

By forming the fourth semiconductor layer 106 between the gate and the source, and between the gate and the drain, a distance can be obtained from the surface of the semiconductor layer to the channel between the gate and the source and between the gate and the drain. Thus, the channel is less influenced by a surface level occurring on the surface of the semiconductor layer, thereby reducing current collapse.

It is considered that the current collapse is caused by electrons trapped by the surface level. If the fourth semiconductor layer 106 is not formed, and high drain bias of about tens of volts is applied in an off-state, the electrons trapped by the surface level of the second semiconductor layer 104 depletes two dimensional electron gas between the gate and the drain. Since discharge speed of the electrons trapped by the surface level is slower than the trapping speed, a depletion layer expands between the gate and the drain even directly after the gate is turned on. Thus, it is considered that the channel is not completely open to increase channel resistance.

By contrast, in the nitride semiconductor transistor of this embodiment including the fourth semiconductor layer 106, the distance between the channel and the surface level is long. Thus, even when high drain bias is applied in an off-state, the two dimensional electron gas between the gate and the drain is not depleted. Therefore, even directly after the gate is turned on, the channel is completely open not to increase the channel resistance.

According to this embodiment, the second semiconductor layer 104 is not buried. That is, the threshold voltage can be controlled without forming any recess in the second semiconductor layer 104.

In this embodiment, since the fourth semiconductor layer 106 is formed after the third semiconductor layer 105, the third semiconductor layer 105 does not overhang the top surface of the fourth semiconductor layer 106.

The third semiconductor layer 105 is preferably formed in the position close to the source electrode 107. By obtaining a long distance between the gate electrode 109 and the drain electrode 108, an electric field occurring when a high drain voltage is applied is mitigated to improve a breakdown voltage of the transistor.

As described above, in the semiconductor device of this embodiment, on-resistance can be reduced. Both reduction in on-resistance and rise in a threshold voltage can be achieved. Furthermore, there is the advantage of reducing current collapse.

Figure 2:
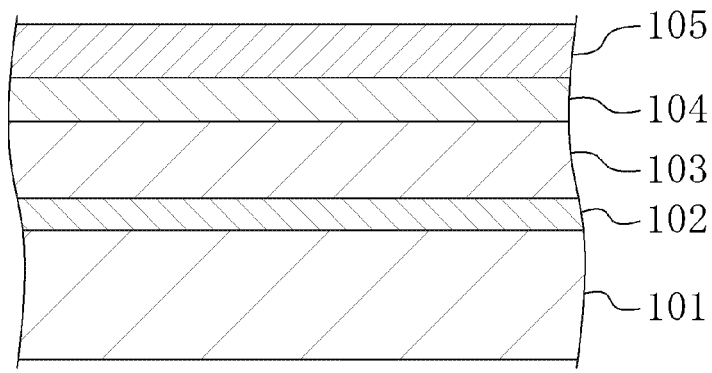
FIGS. 2A-2C are cross-sectional views illustrating a manufacturing method of a semiconductor device according to an embodiment in order of steps.
Figure 2:
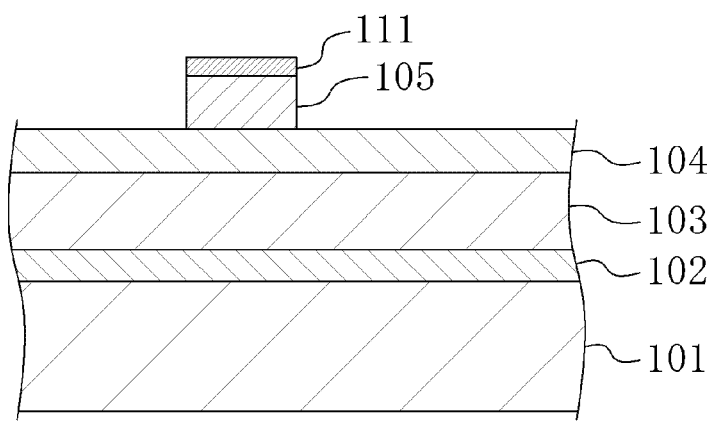
Figure 2:
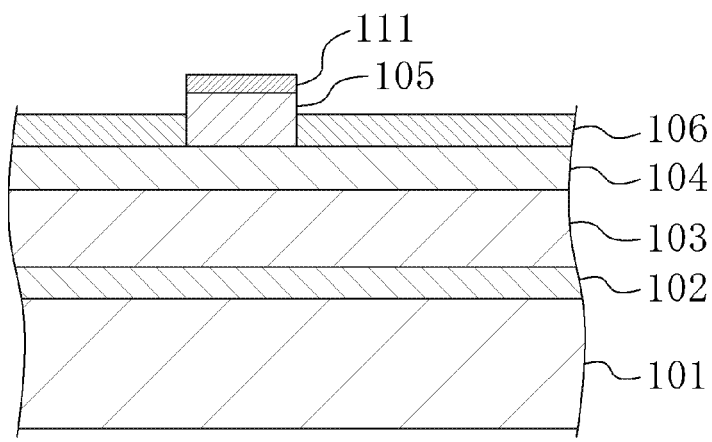

A method of manufacturing the semiconductor device in this embodiment will be described below. First, as shown in FIG. 2A, the buffer layer 102 having the thickness of 100 nm and made of AlN, the first semiconductor layer 103 having the thickness of 2 μm and made of undoped GaN, the second semiconductor layer 104 having the thickness of 15 nm and made of undoped AlGaN, and the third semiconductor layer 105 having the thickness of 100 nm and made of p-type GaN are sequentially epitaxially grown on the (0001) plane of the substrate 101 made of sapphire. Metal organic chemical vapor deposition (MOCVD) is used for the epitaxial growth. The substrate may be made of a material which can form a nitride semiconductor layer. Si or SiC, etc. may be used instead of sapphire.

Then, a $SiO_2$ film 111 is selectively formed in a region for forming a gate mesa portion. After that, as shown in FIG. 2B, the third semiconductor layer 105 is selectively removed by dry etching such as inductive-coupled plasma (ICP) etching using the $SiO_2$ film 111 as an etching mask. At this time, for example, selective dry etching with oxygen gas added to chlorine gas is preferably used so that the etching rate of the AlGaN layer is lower than that of the GaN layer. By using selective etching, the etching residue of the third semiconductor layer 105 which is a p-type GaN layer can be reduced with the second semiconductor layer 104 of AlGaN little etched. This enables formation of the gate mesa portion with high reproducibility. In this step, the third semiconductor layer 105 other than the gate mesa portion is preferably completely removed. However, the complete removal is not necessary and an etching residue of a few nanometers may exist. When removing the third semiconductor layer 105, the second semiconductor layer 104 may be etched about a few nanometers.

Next, as shown in FIG. 2C, the fourth semiconductor layer 106 having the thickness of 35 nm and made of undoped AlGaN is epitaxially grown by MOCVD etc. while retaining the $SiO_2$ film 111. The $SiO_2$ film 111 functions as a growth mask so that the fourth semiconductor layer 106 is not formed on the third semiconductor layer 105. An example has been described where the fourth semiconductor layer 106 is grown only on the second semiconductor layer 104. The fourth semiconductor layer 106 may be grown from a sidewall of the third semiconductor layer 105. In this case, the fourth semiconductor layer 106 is formed to cover the sidewall of the third semiconductor layer 105.

Figure 3:
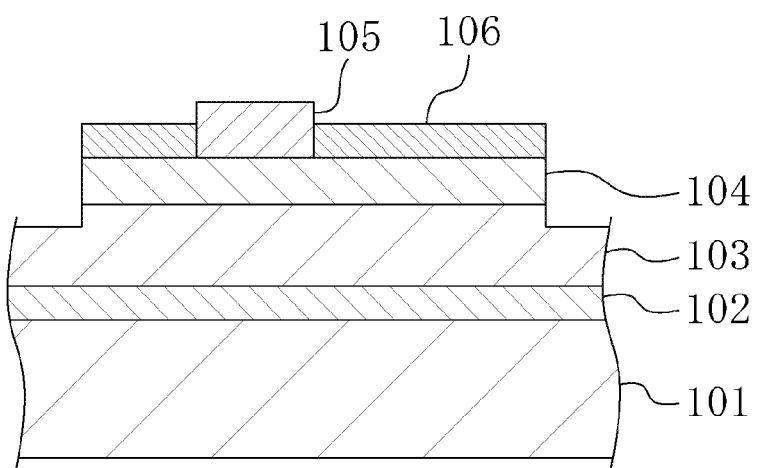
FIGS. 3A and 3B are cross-sectional views illustrating a manufacturing method of a semiconductor device according to an embodiment in order of steps.
Figure 3:
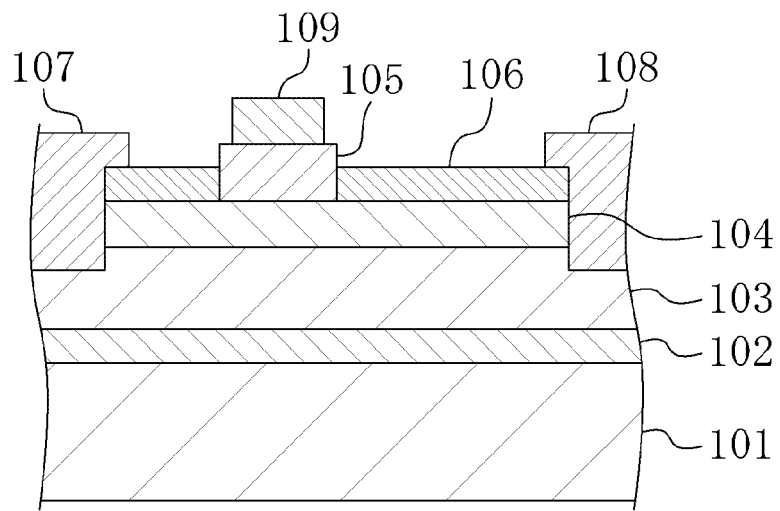

After that, as shown in FIG. 3A, the fourth semiconductor layer 106, the second semiconductor layer 104, and a part the first semiconductor layer 103 are selectively removed in a region for forming the source electrode and the drain electrode by ICP etching etc. using, e.g., chlorine gas to form an ohmic recess portion.

Then, as shown in FIG. 3B, after forming a Ti layer and an Al layer in the ohmic recess portion, heat treatment at a temperature of 650° C. is performed in a nitrogen atmosphere to form the source electrode 107 and the drain electrode 108. As such, when the source electrode 107 and the drain electrode 108 are formed in the ohmic recess portion, a part of the source electrode 107 and a part of the drain electrode 108 are formed to cover parts of the top surface of the fourth semiconductor layer 106. This increases adhesiveness of the source electrode 107 and the drain electrode 108 to the sidewalls. Then, the gate electrode 109 made of Pd is formed on the third semiconductor layer 105.

Figure 4:
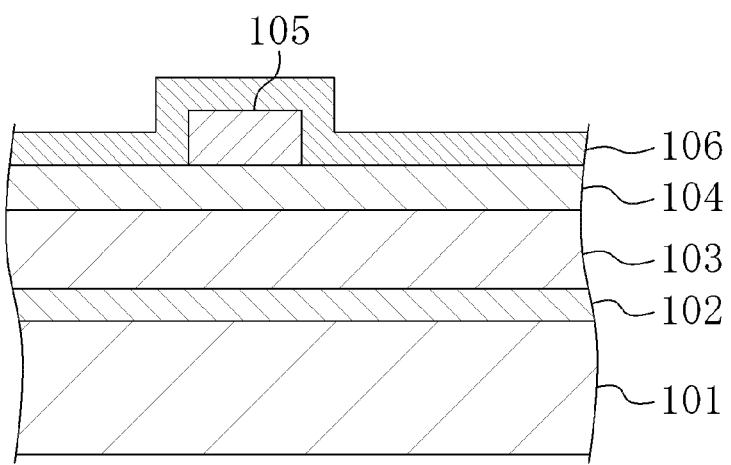
FIGS. 4A and 4B are cross-sectional views illustrating a variation of the manufacturing method of the semiconductor device according to the embodiment in order of steps.
Figure 4:
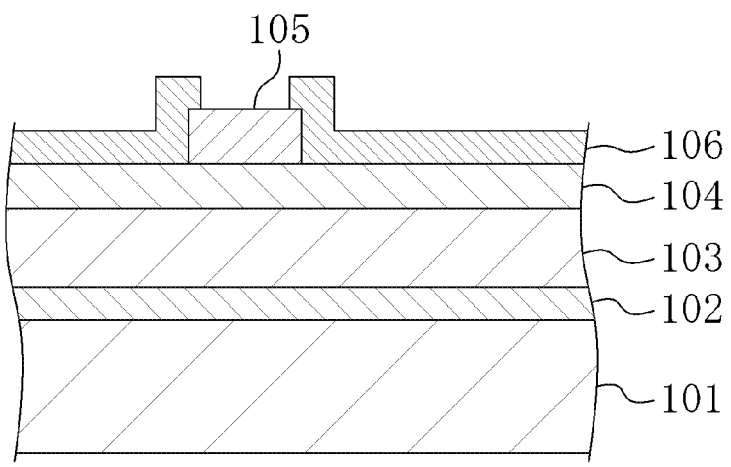
Figure 5:
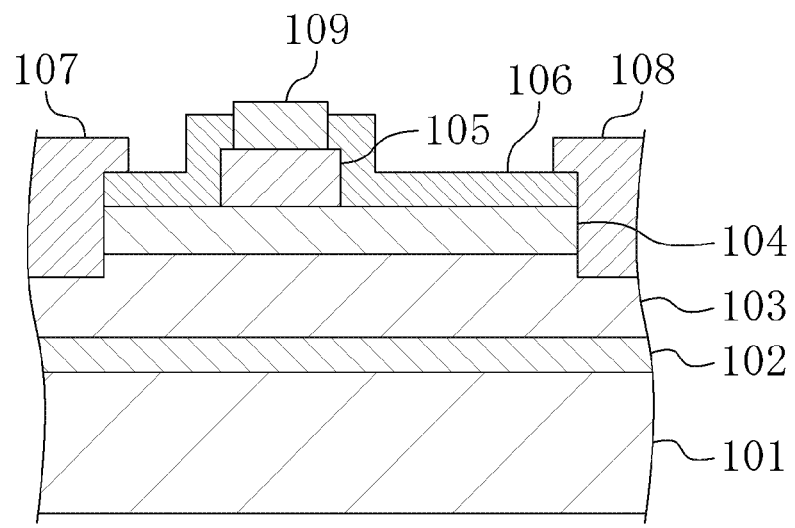
FIG. 5 is a cross-sectional view illustrating a variation of the semiconductor device according to the embodiment.

In this embodiment, an example has been described where the fourth semiconductor layer is regrown with the top surface of the third semiconductor layer 105 covered with the $SiO_2$ film. However, as shown in FIG. 4A, after removing the $SiO_2$ film, the fourth semiconductor layer 106 is regrown, and then, as shown in FIG. 4B, an opening exposing the third semiconductor layer 105 may be formed in the fourth semiconductor layer 106. In this case, as shown in FIG. 5, the fourth semiconductor layer 106 covers not only the top of the second semiconductor layer 104, but the sidewalls and a part of the top surface of the third semiconductor layer 105. When the regrowth is selectively performed using a mask of the $SiO_2$ film, Si from the $SiO_2$ film is introduced as impurities at the interface between the second semiconductor layer 104 and the fourth semiconductor layer 106. This may degrade crystallinity of the fourth semiconductor layer 106. However, with the structure of this embodiment, there is no need to use a mask of a $SiO_2$ film when regrowing the fourth semiconductor layer 106 to improve crystallinity of the fourth semiconductor layer 106. This results in an improvement in an polarization effect and an increase in two dimensional electron gas concentration to reduce channel resistance and to further reduce on-resistance.

The opening may be formed by ICP etching etc. using, e.g., chlorine gas. Alternately, wet etching with ultraviolet irradiation using a potassium hydroxide solution may be used.

In this embodiment, the step of selectively removing the third semiconductor layer 105 is performed between the step of forming the second semiconductor layer 104 and the step of forming the fourth semiconductor layer 106. Thus, the second semiconductor layer 104 and the fourth semiconductor layer 106 are not in-situ formed. Note that in-situ formation means that two nitride semiconductor layers are formed continuously in a same chamber. Whether or not the layers are in-situ formed can be evaluated by the cross-sectional shape etc. of the third semiconductor layer 105 or the fourth semiconductor layer 106. Specifically, when the second semiconductor layer 104 and the fourth semiconductor layer 106 are in-situ formed, the third semiconductor layer 105 needs to be grown after opening the gate region of the fourth semiconductor layer 106 by dry etching etc. Thus, the third semiconductor layer 105 is formed to cover a part of the fourth semiconductor layer 106. On the other hand, in this embodiment, the second semiconductor layer 104 and the fourth semiconductor layer 106 are not in-situ formed, and the steps of forming and selectively removing the third semiconductor layer 105 are performed between the formation of the second semiconductor layer 104 and the formation of the fourth semiconductor layer 106. That is, since the fourth semiconductor layer 106 is grown after the third semiconductor layer 105, the third semiconductor layer 105 does not cover the top of the fourth semiconductor layer 106.

While in this embodiment, the second semiconductor layer 104 is formed in contact with the third semiconductor layer 105, the structure is not limited thereto. Another layer may be inserted between the second semiconductor layer 104 and the third semiconductor layer 105. For example, an etching stop layer used in selectively removing the third semiconductor layer 105 may be inserted. In this case, for example, an etching stop layer having an Al composition ratio of 26% and made of undoped AlGaN may be formed on the second semiconductor layer 104 having an Al composition ratio of 15%, and then the third semiconductor layer 105 having an Al composition ratio of 15% and made of p-type AlGaN may be formed on the etching stop layer. As such, in inserting the etching stop layer, the third semiconductor layer 105 can be selectively removed by utilizing a difference in the Al composition ratio between the third semiconductor layer 105 and the etching stop layer even when the third semiconductor layer 105 is made of AlGaN.

In this embodiment, the fourth semiconductor layer 106 is made of AlGaN with the Al composition ratio equal to that of the second semiconductor layer 104. In this case, the second semiconductor layer 104 is lattice matched with the fourth semiconductor layer 106 regrown on the second semiconductor layer 104, and thus, crystal defects are difficult to introduce at the regrown interface. By reducing crystal defects at the regrown interface, current collapse can be further reduced.

Figure 6:
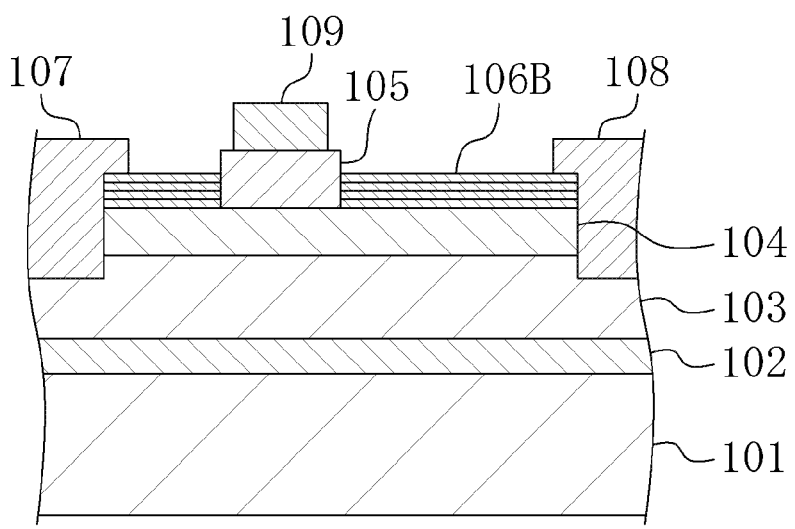
FIG. 6 is a cross-sectional view illustrating a variation of the semiconductor device according to the embodiment.

On the other hand, in order to raise the threshold voltage and reduce on-resistance, it is preferable that the Al composition ratio of the second semiconductor layer 104 be low, and the Al composition ratio of the fourth semiconductor layer 106 be high, as described above. However, when the difference in the Al composition ratio between the second semiconductor layer 104 and the fourth semiconductor layer 106 increases, crystal defects tend to be introduced at the regrown interface. In order to reduce the introduction of crystal defects to the regrown interface and to increase the Al composition ratio of the fourth semiconductor layer 106, a fourth semiconductor layer 106B being a multilayer may be used as shown in FIG. 6. In this case, a layer of the fourth semiconductor layer 106B, which is in contact with the second semiconductor layer 104, may have the Al composition ratio equal to that of the second semiconductor layer 104. The upper the layer is, the higher Al composition ratio the layer may have. With this structure, the Al composition ratio of the entire fourth semiconductor layer 106B increases, and the lowermost layer of the fourth semiconductor layer 106B can be lattice matched with the second semiconductor layer 104. For example, the Al composition ratio of the lowermost layer of the fourth semiconductor layer 106B may be 15%, which is equal to that of the second semiconductor layer 104, and the Al composition ratio of the uppermost layer may be 30%. This feature reduces crystal defects, and improves a polarization effect between the gate and the source and between the gate and the drain. This increases electron concentration of the 2DEG layer, and reduces channel resistance and on-resistance. While in FIG. 6, the number of layers of the fourth semiconductor layer 106B is four, the number is not limited thereto. The layers may be in any number of two or more. The number may be determined in accordance with the thickness of the fourth semiconductor layer 106B, and the difference in the Al composition ratio between the lowermost layer and the uppermost layer. Furthermore, the fourth semiconductor layer 106B is not limited to a multilayer of different layers and may be a single layer, in which the Al composition ratio changes continuously or gradually. Even when the Al composition ratio of the lowermost layer of the fourth semiconductor layer 106B is equal to the Al composition ratio of the second semiconductor layer 104, the interface may be found by a TEM photo etc. since the interface is regrown. However, the interface cannot be necessarily observed. Furthermore, in this embodiment, while the fourth semiconductor layer 106B is made of AlGaN, and the Al composition ratio changes, the material is not limited thereto. For example, in a quaternary compound such as InAlGaN, the In composition ratio and the Al composition ratio may change. In this case, the bandgap can be further increased while the fourth semiconductor layer 106B is lattice matched with the second semiconductor layer 104.

The compositions of the first to fourth semiconductor layers may change as appropriate. For example, the material may be selected from compounds represented by the general expression of $In_xAl_yGa_{1-x-y}N$, where $0 \leq x \leq 1$, $0 \leq y \leq 1$, and $x+y \leq 1$. Note that the second semiconductor layer has a wider bandgap than the first semiconductor layer, and the third semiconductor layer is a p-type layer. The material of the third semiconductor layer is not limited to nitride. It may be, for example, oxide semiconductor such as ZnO, MgO, or NiO.

According to the semiconductor device and the method of manufacturing the device according to the present disclosure, on-resistance can be reduced in a semiconductor device such as a junction field effect transistor. Thus, the semiconductor device and the method of manufacturing the device according to the present disclosure are particularly useful as a power transistor using nitride semiconductor and a manufacturing method of the power transistor.

What is claimed is:

1. A nitride semiconductor device comprising:
a substrate;
a first semiconductor layer formed on the substrate;
a second semiconductor layer formed on the first semiconductor layer, and having greater bandgap energy than the first semiconductor layer;
a p-type third semiconductor layer selectively formed on the second semiconductor layer;
a fourth semiconductor layer formed on the second semiconductor layer; and
a gate electrode formed on the third semiconductor layer, wherein:
the third semiconductor layer does not cover the fourth semiconductor layer,
the third semiconductor layer is made of $Al_yGa_{1-y}N$, where $0 \leq y < 1$,
the fourth semiconductor layer is made of $Al_zGa_{1-z}N$, where $0 < z < 1$, $z \neq y$,
a composition of the fourth semiconductor layer changes continuously or gradually, and
at least a part of the fourth semiconductor layer has greater bandgap energy than the second semiconductor layer.

2. The nitride semiconductor device of claim 1, wherein a part of the fourth semiconductor layer which is in contact with the second semiconductor layer is lattice matched with the second semiconductor layer.

3. The nitride semiconductor device of claim 1, wherein the fourth semiconductor layer is a multilayer formed by stacking a plurality of layers having different compositions.

4. A nitride semiconductor device comprising:
a substrate;
a first semiconductor layer formed on the substrate;
a second semiconductor layer formed on the first semiconductor layer, and having greater bandgap energy than the first semiconductor layer;
a p-type third semiconductor layer selectively formed on the second semiconductor layer;
a fourth semiconductor layer formed on the second semiconductor layer; and
a gate electrode formed on the third semiconductor layer, wherein:
the third semiconductor layer does not cover the fourth semiconductor layer,
the third semiconductor layer is made of $Al_yGa_{1-y}N$, where $0 \leq y < 1$,
the fourth semiconductor layer is made of $Al_zGa_{1-z}N$, where $0 < z < 1$, $z \neq y$, and
a top surface of the third semiconductor layer is partly covered by the fourth semiconductor layer.

5. A nitride semiconductor device comprising:
a substrate;
a first semiconductor layer formed on the substrate;
a second semiconductor layer formed on the first semiconductor layer, and having greater bandgap energy than the first semiconductor layer;
a p-type third semiconductor layer selectively formed on the second semiconductor layer;
a fourth semiconductor layer formed on the second semiconductor layer; and
a gate electrode formed on the third semiconductor layer, wherein:
the third semiconductor layer does not cover the fourth semiconductor layer,
the third semiconductor layer is made of $Al_yGa_{1-y}N$, where $0 \leq y < 1$,
the fourth semiconductor layer is made of $Al_zGa_{1-z}N$, where $0 < z < 1$, $z \neq y$, and
a top surface of the third semiconductor layer is located higher than a highest part of a top surface of the fourth semiconductor layer measured from a surface of the substrate.

6. A nitride semiconductor device comprising:
a substrate;
a first semiconductor layer formed on the substrate;
a second semiconductor layer formed on the first semiconductor layer, and having greater bandgap energy than the first semiconductor layer;
a p-type third semiconductor layer formed on the second semiconductor layer;
a fourth semiconductor layer formed on the second semiconductor layer; and
a gate electrode formed on the third semiconductor layer, wherein:
the third semiconductor layer does not cover the fourth semiconductor layer,
the third semiconductor layer is made of $Al_yGa_{1-y}N$, where $0 \leq y < 1$,
the fourth semiconductor layer is made of $Al_zGa_{1-z}N$, where $0 < z < 1$, $z \neq y$, and
a bandgap energy of the fourth semiconductor layer is greater than a bandgap energy of the third semiconductor layer.

7. The nitride semiconductor device of claim 6, wherein the first semiconductor layer is made of GaN, and the second semiconductor layer is made of $Al_xGa_{1-x}N$, where $0 < x \leq 1$.

8. The nitride semiconductor device of claim 6, wherein the nitride semiconductor device is a normally-off transistor.

9. The nitride semiconductor device of claim 6, wherein the second semiconductor layer and the fourth semiconductor layer are not formed in-situ.

10. The nitride semiconductor device of claim 6, wherein the third semiconductor layer is made of GaN.

* * * * *